United States Patent
Sung et al.

(10) Patent No.: US 7,564,060 B2
(45) Date of Patent: Jul. 21, 2009

(54) DISPLAY DEVICE PREVENTING SHORT OF DRIVING VOLTAGE LINES

(75) Inventors: Un-Cheol Sung, Anyang-si (KR);
Joo-Hyeon Lee, Yongin-si (KR);
Sang-Pil Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/675,832

(22) Filed: Feb. 16, 2007

(65) Prior Publication Data

US 2007/0194705 A1 Aug. 23, 2007

(30) Foreign Application Priority Data

Feb. 17, 2006 (KR) .................. 10-2006-0015611

(51) Int. Cl.
| H01L 27/14 | (2006.01) |
| H01L 29/04 | (2006.01) |
| H01L 29/15 | (2006.01) |
| H01L 31/036 | (2006.01) |

(52) U.S. Cl. .......................... 257/72; 257/59
(58) Field of Classification Search ............. 257/59, 257/72
See application file for complete search history.

(56) References Cited

U.S. PATENT DOCUMENTS

| 6,811,896 B2 | 11/2004 | Aziz et al. |
| 6,946,791 B2* | 9/2005 | Choi et al. ............ 313/506 |
| 2004/0189192 A1 | 9/2004 | Huang |
| 2005/0179625 A1* | 8/2005 | Choi et al. ............ 345/76 |
| 2006/0001366 A1* | 1/2006 | Chung et al. ............ 313/506 |
| 2006/0197086 A1* | 9/2006 | Rhee et al. ............ 257/59 |
| 2007/0117257 A1* | 5/2007 | Kim et al. ............ 438/99 |

FOREIGN PATENT DOCUMENTS

| JP | 2003131593 | 5/2003 |
| JP | 2003249380 | 9/2003 |
| JP | 2004191627 | 7/2004 |
| JP | 2005268137 | 9/2005 |
| JP | 2005276446 | 10/2005 |
| KR | 1020030057632 | 7/2003 |
| KR | 1020030074207 | 9/2003 |
| KR | 1020050043285 | 5/2005 |
| KR | 1020050065833 | 6/2005 |

* cited by examiner

*Primary Examiner*—Jerome Jackson, Jr.
*Assistant Examiner*—Anthony Ho
(74) *Attorney, Agent, or Firm*—Cantor Colburn LLP

(57) ABSTRACT

A display includes a substrate, a plurality of first and second signal lines formed on the substrate and insulated from each other, a plurality of driving voltage lines formed with a same layer as the first signal lines, at least one driving voltage connection formed with a same layer as the second signal lines, at least one connecting member electrically connecting the driving voltage lines and the driving voltage connection, at least one first thin film transistor connected to the first and second signal lines, at least one second thin film transistor connected to the first thin film transistor and the driving voltage lines, at least one first electrode connected to the second thin film transistors, at least one second electrode opposing the first electrode, at least one organic light emitting member formed between the first electrode and the second electrode, and at least one assistant member formed between the connecting member and the second electrode.

13 Claims, 15 Drawing Sheets

DISPLAY DEVICE PREVENTING SHORT OF DRIVING VOLTAGE LINES

This application claims priority to Korean Patent Application No. 10-2006-0015611, filed on Feb. 17, 2006, and all the benefits accruing therefrom under 35 U.S.C. § 119, the contents of which in its entirety are herein incorporated by reference.

BACKGROUND OF THE INVENTION (a) Field of the Invention

The present invention relates to a display device and a manufacturing method thereof. More particularly, the present invention relates to a display device preventing a short of its driving voltage lines, and a manufacturing method of the display device.

(b) Description of the Related Art

Recent trends toward lightweight and thin personal computers and television sets also require lightweight and thin display devices, and flat panel displays satisfying such requirements are being substituted for conventional cathode ray tubes ("CRTs").

The flat panel displays include a liquid crystal display ("LCD"), a field emission display ("FED"), an organic light emitting diode ("OLED") display, a plasma display panel ("PDP"), and so on.

Among the flat panel displays, the OLED display is the most promising because of its low power consumption, fast response time, wide viewing angle, and high contrast ratio.

An OLED display is a self-emissive display device, which includes two electrodes and an organic light emitting layer interposed between the two electrodes. One of the two electrodes injects holes and the other injects electrons into the light emitting layer. The injected electrons and holes are combined to form excitons and the excitons emit light as discharge energy.

The OLED is divided into a passive matrix OLED display and an active matrix OLED display according to driving type.

The active matrix OLED display includes a plurality of switching thin film transistors ("TFTs") connected to the signal lines that cross each other, a plurality of driving TFTs connected to the switching TFTs and the driving voltage lines, and a plurality of emitting portions connected to the driving TFTs.

Here, the driving voltage lines are parallel to one of the signal lines and receive the driving voltage through a driving voltage connection and a driving voltage pad that are formed at different layers.

The driving voltage lines and the driving voltage connection are connected to each other through conductors via contact holes. However, the conductor may be easily shorted to one electrode of the emitting diodes.

BRIEF SUMMARY OF THE INVENTION

Exemplary embodiments of the present invention provide a display device preventing the short of driving voltage lines and a method of manufacturing the display device.

According to exemplary embodiments of the present invention, a display is provided including a substrate, a plurality of first and second signal lines formed on the substrate and insulated from each other, a plurality of driving voltage lines formed with a same layer as the first signal lines, at least one driving voltage connection formed with a same layer as the second signal lines, at least one connecting member electrically connecting the driving voltage lines and the at least one driving voltage connection, at least one first thin film transistor ("TFT") connected to the first and second signal lines, at least one second TFT connected to the at least one first TFT and the driving voltage lines, at least one first electrode connected to the at least one second TFT, at least one second electrode opposing the at least one first electrode, at least one organic light emitting member formed between the at least one first electrode and the at least one second electrode, and at least one assistant member formed between the at least one connecting member and the at least one second electrode.

The at least one assistant member may include an insulating material, and may include a same material as the at least one organic light emitting member. The at least one assistant member and the at least one organic light emitting member may be made of one body.

The display device may further include a photosensitive insulating layer formed between the at least one connecting member and the at least one assistant member. The at least one connecting member may be formed with a same layer as the at least one first electrode.

A thickness of the assistant member may be in a range of 500 to 3000 angstroms. The assistant member may thus prevent the at least one connecting member from shorting with the at least one second electrode.

According to other exemplary embodiments of the present invention, a display is provided including a substrate, a plurality of first and second signal lines formed on the substrate and insulated from each other, a plurality of driving voltage lines formed with a same layer as the first signal lines, at least one driving voltage connection formed with a same layer as the second signal lines, at least one connecting member electrically connecting the driving voltage lines and the at least one driving voltage connection, at least one first TFT connected to the first and second signal lines, at least one second TFT connected to the at least one first TFT and the driving voltage lines, at least one first electrode connected to the at least one second TFT, at least one organic light emitting member formed on the at least one first electrode and the at least one connecting member, and at least one second electrode facing the at least one first electrode.

The at least one organic light emitting member may include a first organic light emitting member formed between the at least one first electrode and the at least one second electrode, and a second organic light emitting member apart from the first organic light emitting member, and the display device may further include a photosensitive insulating layer formed under the second organic light emitting member. Thus the at least one organic light emitting member prevents the at least one connecting member from shorting with the at least one second electrode.

According to still other exemplary embodiments of the present invention, a display is provided including a display region including a plurality of pixels, and a peripheral region excluding the display region, wherein the pixels include a first electrode, a second electrode facing the first electrode, and an organic light emitting member formed between the first electrode and the second electrode, and the organic light emitting member further formed on the peripheral region.

The display device may further include a driving voltage line extended from the display region to the peripheral region, a driving voltage connection formed in the peripheral region, and a connecting member connecting the driving voltage line to the driving voltage connection, wherein the organic light emitting member covers the connecting member.

According to yet other exemplary embodiments of the present invention, a method for manufacturing a display is provides including forming a first signal line including a first control electrode, a second control electrode separated from the first signal line, and a driving voltage connection on a substrate, forming a gate insulating layer on the substrate, forming a semiconductor layer on the insulating layer, forming a second signal line including a first input electrode, a first output electrode facing the first input electrode, a driving voltage line including a second input electrode, and a second output electrode facing the second input electrode on the gate insulating layer and the semiconductor layer, forming a passivation layer on the second signal line, the first output electrode, the driving voltage line, and the second output electrode, forming a pixel electrode connected to the second output electrode, a first connecting member connecting the first output electrode to the second control electrode, and a second connecting member connecting the driving voltage connection to the driving voltage line, forming an organic light emitting member on the pixel electrode and the second connecting member, and forming a common electrode on the organic light emitting member.

The organic light emitting member may be formed by inkjet printing or deposition. The method may further include forming a photosensitive insulating layer before forming the organic light emitting member, and forming an opening in the photosensitive insulating layer to expose the pixel electrode.

According to other exemplary embodiments of the present invention, a method for manufacturing a display includes forming a first signal line including a first control electrode, a second control electrode separated from the first signal line, and a driving voltage connection on a substrate, forming a gate insulating layer on the substrate, forming a semiconductor layer on the insulating layer, forming a second signal line including a first input electrode, a first output electrode facing the first input electrode, and a driving voltage line including a second input electrode and a second output electrode facing the second input electrode on the gate insulating layer and the semiconductor layer, forming a passivation layer on the second signal line, the first output electrode, the driving voltage line, and the second output electrode, forming a pixel electrode connected to the second output electrode, a first connecting member connecting the first output electrode to the second control electrode, and a second connecting member connecting the driving voltage connection to the driving voltage line, forming an organic light emitting member on the pixel electrode, forming an insulating layer on the second connecting member, and forming a common electrode on the organic light emitting member and the insulating layer.

The insulating layer may be formed by using a shadow mask.

According to still other exemplary embodiments of the present invention, a method of preventing a connecting member in an organic light emitting diode display from shorting with a common electrode of the display, the connecting member connecting a driving voltage line extending from a display region of the display to a driving voltage connection in a peripheral region of the display, includes forming an organic light emitting member in the peripheral region between the connecting member and the common electrode within a same layer and from a same material as an organic light emitting member within the display region.

BRIEF DESCRIPTION OF THE DRAWINGS

The present invention will become more apparent by describing preferred exemplary embodiments thereof in detail with reference to the accompanying drawings, in which.

DETAILED DESCRIPTION OF THE INVENTION

Figure 1:
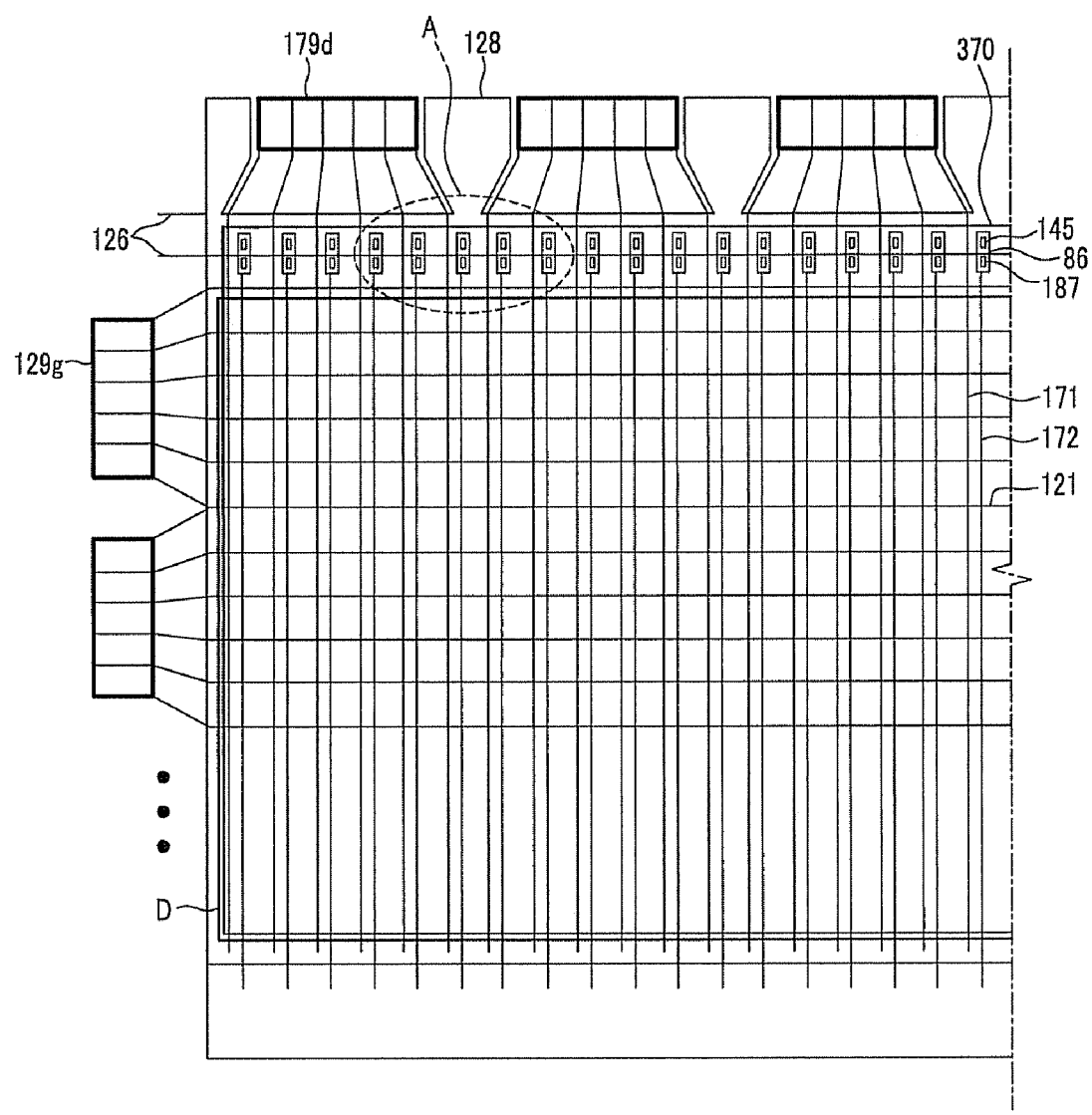
FIG. 1 is a schematic plan view of an exemplary OLED according to an exemplary embodiment of the present invention.

The present invention will be described more fully hereinafter with reference to the accompanying drawings, in which preferred embodiments of the invention are shown. The present invention may, however, be embodied in many different forms and should not be construed as limited to the embodiments set forth herein.

In the drawings, the thickness of layers, films, panels, regions, etc., are exaggerated for clarity. Like numerals refer to like elements throughout. It will be understood that when an element such as a layer, film, region, or substrate is referred to as being "on" another element, it can be directly on the other element or intervening elements may also be present. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Now, an OLED according to an exemplary embodiment of the present invention will be described in detail with reference to FIGS. 1-3.

Figure 2:
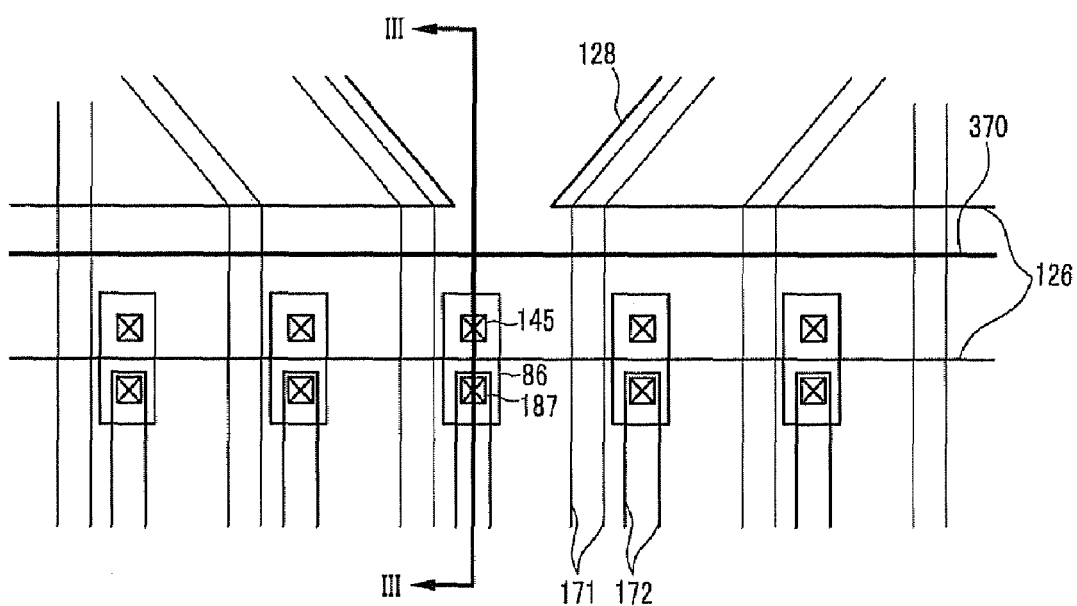
FIG. 2 is an enlarged view of portion A in the exemplary OLED of FIG. 1.
Figure 3:
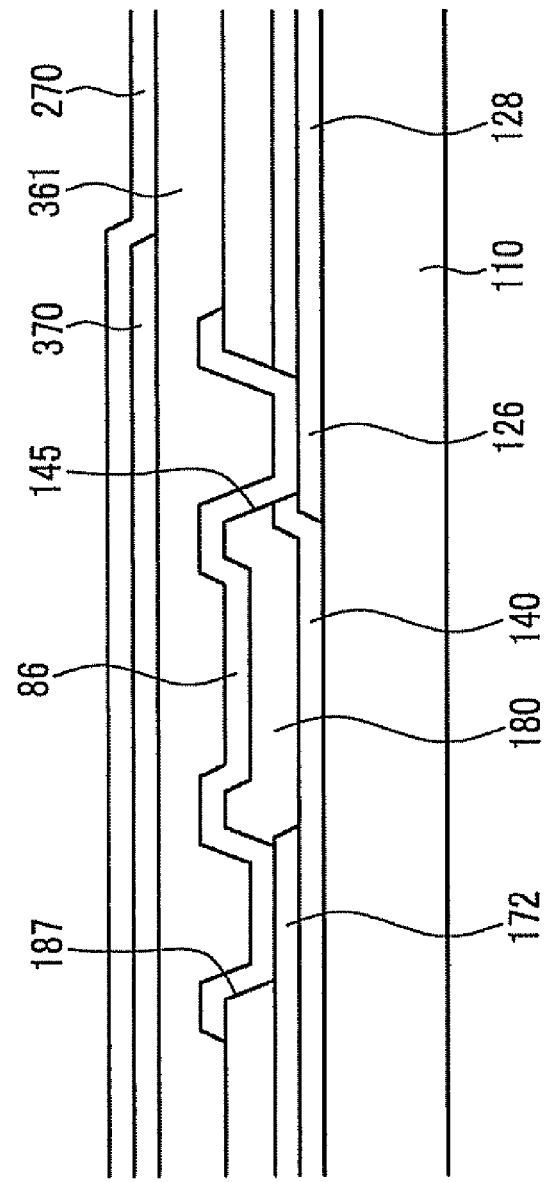
FIG. 3 is a sectional view of the exemplary OLED shown in FIG. 2 taken along line III-III.

FIG. 1 is a schematic plan view of an exemplary OLED according to an exemplary embodiment of the present invention, FIG. 2 is an enlarged view of portion A in the exemplary OLED of FIG. 1, and FIG. 3 is a sectional view of the exemplary OLED shown in FIG. 2 taken along line III-III.

Referring to FIG. 1, an OLED display according to an exemplary embodiment of the present invention includes a plurality of gate lines 121, a plurality of data lines 171, a plurality of driving voltage lines 172, and a plurality of pixels connected thereto and defined by the gate lines 121 and the data lines 171.

The gate lines 121 transmit gate signals (or scanning signals), and extend substantially parallel to each other in a transverse direction, a first direction.

A number of groups of end portions of a predetermined number of gate lines 121 are respectively connected to gate pad portions 129g for connecting a gate driving circuit (not shown) with the predetermined number of gate lines 121, and the end portions of the gate lines 121 in each group have a spoke shape with end portions of decreasing distance from each other connected to a gate pad portion 129g.

The data lines 171 for transmitting data signals (or image signals) intersect over the gate lines 121, and extend substantially parallel to each other in a vertical direction, a second direction, where the second direction is substantially perpendicular to the first direction.

A number of groups of end portions of a predetermined number of data lines 171 are respectively connected to data pad portions 179d for connecting a data driving circuit (not shown) with the predetermined number of data lines 171, and the end portions of the data lines 171 in each group have a spoke shape with end portions of decreasing distance from each other connected to a data pad portion 179d.

The driving voltage lines 172 for transmitting driving voltages intersect over the gate lines 121 and also extend substantially in a vertical direction, substantially parallel to the data lines 171.

As shown in FIGS. 1-3, the end portions of the driving voltage lines 172 are connected to driving voltage connections 126, and the driving voltage connections 126 are connected to driving voltage pads 128.

The driving voltage connections 126 are formed within a same layer of the OLED display as the gate lines 121 on a substrate 110, and the driving voltage lines 172 are formed within a same layer of the OLED display as the data lines 171 on a gate insulating layer 140 covering the layer including the driving voltage connections 126 and the gate lines 121.

A passivation layer 180 is formed on the driving voltage connections 126 and the driving voltage lines 172.

The passivation layer 180 has a plurality of contact holes 187 exposing portions of the driving voltage lines 172, and a plurality of contact holes 145 exposing portions of the driving voltage connections 126.

A plurality of connecting members 86 overlap the passivation layer 180 and are connected to the driving voltage lines 172 and the driving voltage connections 126 through the contact holes 187 and 145, respectively.

A partition 361 made of a photosensitive material is formed on the connecting members 86, and an organic light emitting member 370 is formed on the partition 361. The organic light emitting member 370 is extended from a display region D and covers the connecting members 86 in a non-display region, hereinafter referred to as a peripheral region. A common electrode 270 is formed on the organic light emitting member 370.

The organic light emitting member 370 that is extended from the display region D functions as an insulating layer in a peripheral region excluding the display region D, such that the organic light emitting layer 370 prevents the connecting members 86 from shorting with the common electrode 270 without an additional process.

Figure 4:
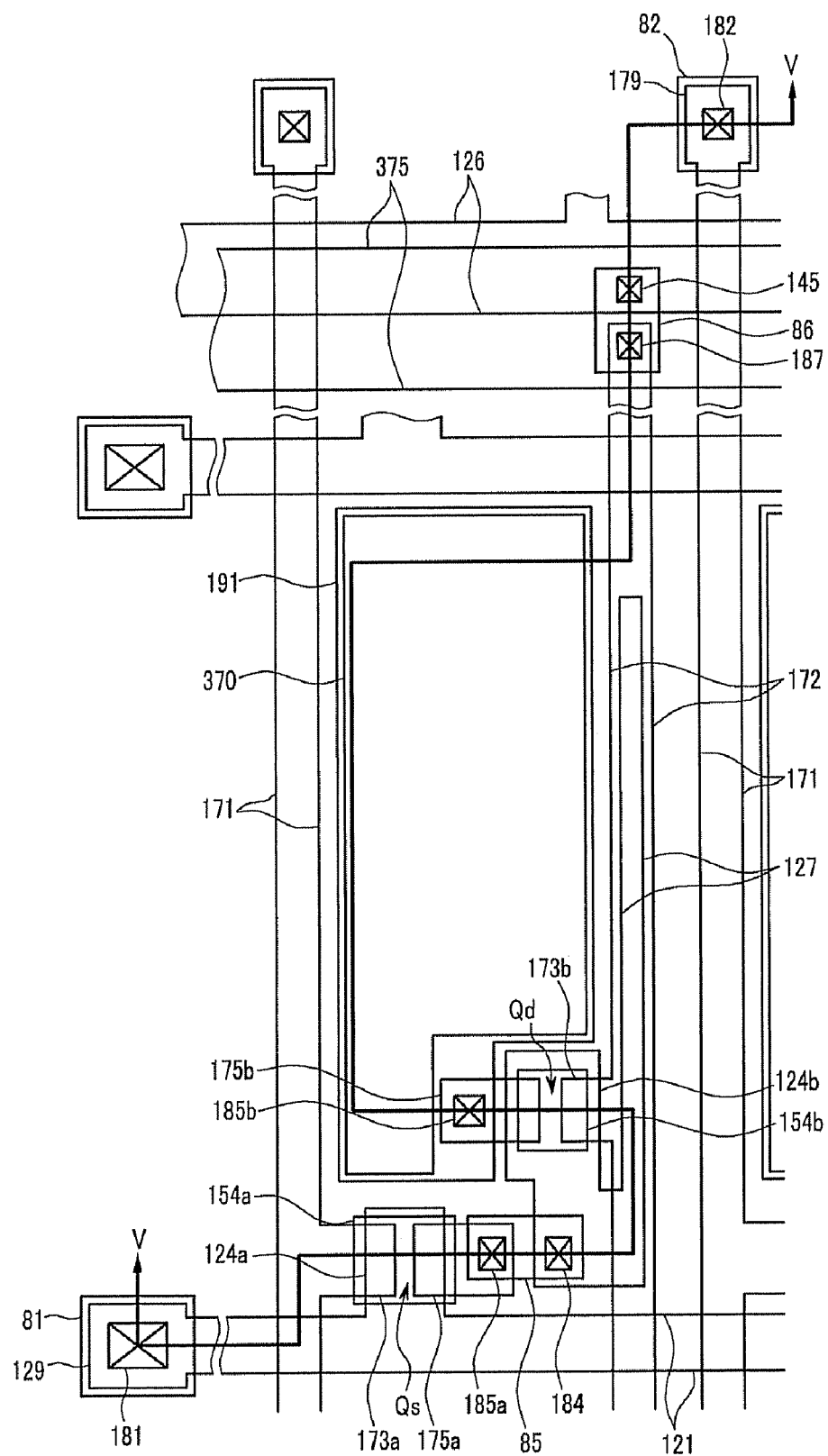
FIG. 4 is a layout view of an exemplary display panel for an exemplary OLED according to another exemplary embodiment of the present invention.
Figure 5:
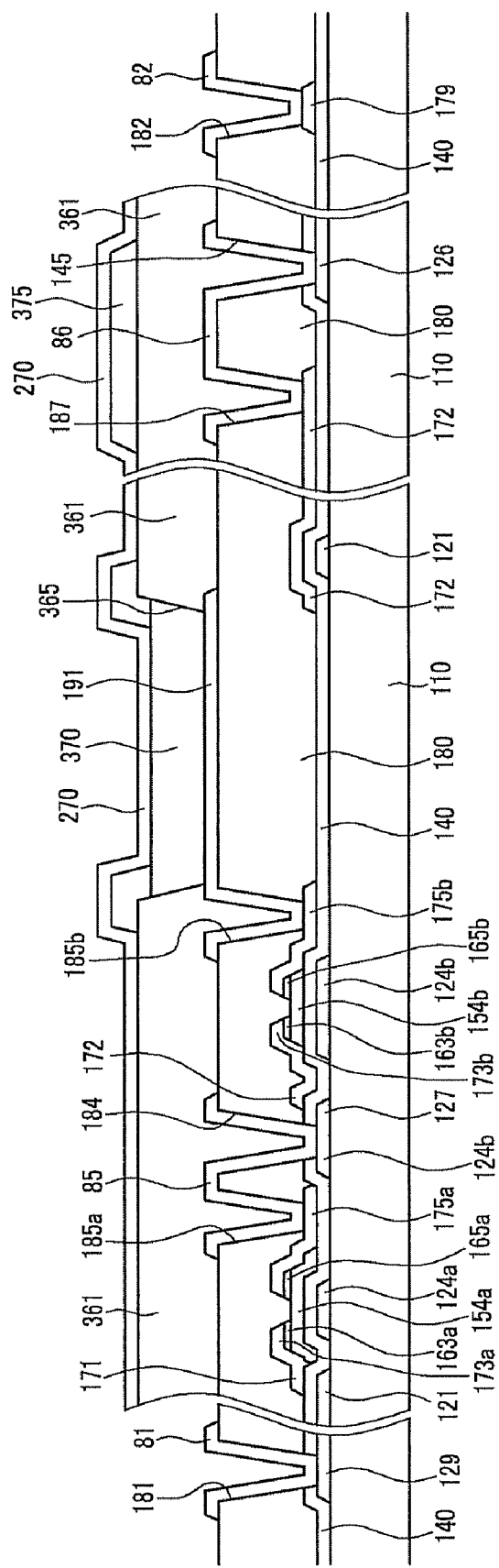
FIG. 5 is a sectional view of the exemplary display panel shown in FIG. 4 taken along line V-V.

Referring to FIGS. 4 to 5, a structure of the exemplary OLED display according to another exemplary embodiment of the present invention will be described in detail.

FIG. 4 is a layout view of an exemplary display panel for an exemplary OLED according to another exemplary embodiment of the present invention, and FIG. 5 is a sectional view of the exemplary display panel shown in FIG. 4 taken along line V-V.

A plurality of gate conductors that include a plurality of gate lines 121 including first control electrodes 124a, a plurality of second control electrodes 124b, and a driving voltage connection 126 are formed on an insulating substrate 110 made of a material such as, but not limited to, transparent glass or plastic.

The gate lines 121 for transmitting gate signals extend substantially parallel to each other in a transverse direction, a first direction. Each gate line 121 further includes an end portion 129 having a large area for contact with another layer or an external driving circuit, and the first control electrodes 124a project upward from the gate line 121, in a direction towards a previous adjacent gate line 121. The gate lines 121 may extend to be directly connected to a gate driving circuit (not shown) for generating the gate signals, which may be integrated on the substrate 110.

Each of the second control electrodes 124b is separated from the gate lines 121 and includes portions extending downward, rightward, and upward to form a storage electrode 127.

The driving voltage connection 126 is substantially parallel to the gate lines 121, and is disposed between a display region and a pad region of the OLED display.

The gate conductors 121, 124b, and 126 are preferably made of an aluminum Al-containing metal such as Al and an Al alloy, a silver Ag-containing metal such as Ag and a Ag alloy, a copper Cu-containing metal such as Cu and Cu alloy, a molybdenum Mo-containing metal such as Mo and a Mo alloy, chromium Cr, tantalum Ta, titanium Ti, etc. The gate conductors 121, 124b, and 126 may have a multi-layered structure including two films having different physical characteristics.

The lateral sides of the gate conductors 121, 124b, and 126 are inclined relative to a surface of the substrate 110, and the inclination angle thereof ranges from about 30 to about 80 degrees. A gate insulating layer 140, preferably made of silicon nitride (SiNx) or silicon oxide (SiOx), is formed on the gate conductors 121, 124b, and 126 and on the exposed portions of the substrate 110.

A plurality of semiconductor islands 154a and 154b preferably made of hydrogenated amorphous silicon ("a-Si") or polysilicon are formed on the gate 15' insulating layer 140. The semiconductor islands 154a and 154b are respectively disposed on the first and second control electrodes 124a and 124b.

A plurality of pairs of first ohmic contacts 163a and 165a and a plurality of pairs of second ohmic contacts 163b and 165b are formed on the semiconductor islands 154a and 154b, respectively. The ohmic contacts 163a, 163b, 165a, and 165b are preferably made of silicide or n+ hydrogenated a-Si heavily doped with an n-type impurity such as phosphorous. The first ohmic contacts 163a and 165a are located in pairs on the semiconductor islands 154a, and the second ohmic contacts 163b and 165b are located in pairs on the semiconductor islands 154b.

A plurality of data conductors including a plurality of data lines 171, a plurality of driving voltage lines 172, and a plurality of first and second output electrodes 175a and 175b are formed on the ohmic contacts 163a, 163b, 165b, and 165b and the gate insulating layer 140.

The data lines 171 for transmitting data signals extend substantially parallel to each other in the longitudinal direction, a second direction, and intersect the gate lines 121, where the second direction may be substantially perpendicular to the first direction. Each data line 171 includes a plurality of first input electrodes 173a extending toward the first control electrodes 124a and an end portion 179 having a large area for contact with another layer or an external driving circuit. The data lines 171 may extend to be directly connected to a data driving circuit (not shown) for generating the data signals, which may be integrated with the substrate 110.

The driving voltage lines 172 for transmitting driving voltages extend substantially parallel to each other and the data lines 171 in the longitudinal direction and intersect the gate lines 121. Each driving voltage line 172 includes a plurality of second input electrodes 173b extending toward the second control electrodes 124b, and overlaps the storage electrode 127.

The first and second output electrodes 175a and 175b are separated from each other and from the data lines 171 and the driving voltage lines 172. Each pair of the first input electrodes 173a and the first output electrodes 175a are disposed opposite each other with respect to a first control electrode 124a, and each pair of the second input electrodes 173b and the second output electrodes 175b are disposed opposite each other with respect to a second control electrode 124b. A channel region is formed on the semiconductor islands 154a and 154b between the pairs of first input electrodes 173a and first output electrodes and between the pairs of second input electrodes 173b and second output electrodes 175b, respectively.

The data conductors 171, 172, 175a, and 175b are preferably made of the same low resistivity material as that of the gate conductors 121, 124b, and 126.

Like the gate conductors 121, 124b, and 126, the data conductors 171, 172, 175a, and 175b have inclined edge profiles, and the inclination angles thereof range from about 30 to about 80 degrees.

A passivation layer 180 is formed on the data conductors 171, 172, 175a, and 175b, the exposed portions of the semiconductor islands 154a and 154b, and the exposed portions of the gate insulating layer 140.

The passivation layer 180 is preferably made of an inorganic or organic insulator, and may have a flat top surface. Examples of the inorganic insulator include silicon nitride and silicon oxide. The organic insulator may have photosensitivity and a dielectric constant of less than about 4.0. The passivation layer 180 may include a lower film of an inorganic insulator and an upper film of an organic insulator such that it takes the excellent insulating characteristics of the organic insulator while preventing the exposed portions of the semiconductor members 154a and 154b from being damaged by the organic insulator.

The passivation layer 180 has a plurality of contact holes 182, 185a, 185b, and 187 exposing the end portions 179 of the data lines 171, the first output electrodes 175a, the second output electrodes 175b, and the driving voltage line 172, respectively, and the passivation layer 180 and the gate insulating layer 140 have a plurality of contact holes 181, 184, and 145 exposing the end portions 129 of the gate lines 121, the second control electrodes 124b, and the driving voltage connection 126, respectively.

A plurality of pixel electrodes 191, a plurality of first and second connecting members 85 and 86, and a plurality of contact assistants 81 and 82 are formed on the passivation layer 180, and they are preferably made of a transparent conductor such as indium tin oxide ("ITO") or indium zinc oxide ("IZO"), or a reflective conductor such as Al, Ag, or alloys thereof.

The pixel electrodes 191 are connected to the second output electrodes 175b through the contact holes 185b. The first connecting members 85 are connected to the second control electrodes 124b and the first output electrodes 175a through the contact holes 184 and 185a, respectively. The second connecting members 86 are connected to the driving voltage lines 172 and the driving voltage connection 126 through the contact holes 187 and 145, respectively. When the OLED display is a top emission type, the pixel electrode 191 may include a material having high work function such as Au, Pt, Ni, Cu, W, and an alloy thereof.

The contact assistants 81 and 82 are connected to the end portions 129 of the gate lines 121 and the end portions 179 of the data lines 171 through the contact holes 181 and 182, respectively, and they protect the end portions 129 and 179 and enhance the adhesion between the end portions 129 and 179 and external devices.

A partition 361 is formed on the passivation layer 180. The partition 361 surrounds the pixel electrodes 191 like a bank to define openings 365, exposing the pixel electrodes 191, and the partition 361 is preferably made of an organic insulating material having thermal resistance and solvent resistance such as acrylic resin and polyimide resin or an inorganic insulating material such as silicon dioxide ($SiO_2$) or titanium dioxide ($TiO_2$), and may have a multi-layered structure. The partition 361 may be made of a photosensitive material containing a black pigment so that the black partition 361 may serve as a light blocking member and the formation of the partition 361 may be simplified.

A plurality of light emitting members 370 are formed on the pixel electrodes 191 and confined in the openings 365 defined by the partition 361.

Each of the light emitting members 370 may have a multi-layered structure including an emitting layer (not shown) for emitting light, and auxiliary layers (not shown) for improving the efficiency of light emission of the emitting layer.

Each of the light emitting members 370 is preferably made of an organic material uniquely emitting light of one color within a set of colors, such as primary colors, such as red, green, and blue, a high molecular weight compound, a low molecular weight compound, or a mixture thereof. For example, the high molecular weight compound may be a polyfluorene derivative, a (poly)paraphenylenevinylene derivative, a polyphenylene derivative, polyvinylcarbazole, a polythiophene derivative; and the low molecular weight compound may be anthracene such as 9,10-diphenylanthracene, butadiene such as tetraphenylbutadiene, tetracene, a distyrylarylene derivative, a benzazole derivative, and a carbazole derivative. Additionally, a dopant such as xanthene, perylene, cumarine, rhodamine, rubrene, a dicyanomethylenepyran compound, thiopyran, a (thia)pyrilium compound, a periflanthene derivative, an indenoperylene derivative, a carbostyryl compound, Nile red, quinacridone, etc., may be doped to the low or high molecular weight compound as a host material to increase the emitting efficiency.

The OLED display displays images by spatially adding the monochromatic color light emitted from the light emitting members 370.

The auxiliary layers may include an electron transport layer (not shown) and a hole transport layer (not shown) for improving the balance of electrons and holes, and an electron injecting layer (not shown) and a hole injecting layer (not shown) for improving the injection of the electrons and holes.

The hole transport layer and the hole injecting layer may be made of a material having a work function that lies between that of the pixel electrodes 191 and that of the emission layer, and the electron transport layer and the electron injecting layer may be made of a material having a work function that lies between that of a common electrode 270 and that of the emission layer, where the common electrode 270 may be formed on the light emitting members 370 and the partition 361, as will be further described below.

For example, the hole transport layer and the hole injecting layer may be made of a compound such as a diamine compound, MTDATA [4,4',4"-tris(3-menthylphenyl) phenylamino]triphenylamine, TPD (N,N'-diphenyl-N,N'-di(3-menthylphenyl)-1,1'-biphenyl-4,4'-diamine), 1,1-bis(4-di-p-tolylaminophenyl)cyclohexane, N,N,N'N'-tetra(2-naphthyl)-4,4-diamino-p-terphenyl, 4,4',4-tris[(3-methylphenyl) phenylamino]triphenylamine, polypyrrole, polyaniline, and poly-(3,4-ethylenedioxythiophene):polystyrene sulfonate (PEDOT:PSS).

The light emitting members 370 uniquely emitting light of one color within the set of colors, such as primary colors, such as red, green, and blue, are preferably respectively arranged in each pixel of the OLED display, and the light emitting members 370 emitting light of three colors, such as red, green, and blue may be all arranged in one pixel with vertical or horizontal deposition to form a white emitting layer under or above the color filters emitting light of one of the colors, such as red, green, and blue. Here, the color filters may be disposed under the emitting layer in a bottom emission type, or the color filters may be disposed on the emitting layer in a top emission type.

Furthermore, the luminance can be improved by further including the white pixel (W) as well as the red, green, and blue pixels (R, G, B) with stripe or check arrangements.

An assistant member 375 is formed on the second connecting members 86 on the partitions 361.

As described above, the assistant member 375 is made from the same material and within the same layer as the organic light emitting members 370, and may include one of the emitting layer and auxiliary layers. The assistant member 375 may have a thickness of about 500 to 3000 angstroms.

In the illustrated embodiment, the assistant member 375 and the organic light emitting members 370 are separated. Alternatively, the organic light emitting member 370 may be extended on the second connecting members 86 such that it is made of one body with the assistant member 375.

The common electrode 270 is formed on the light emitting members 370 and the partition 361, and may be further formed on the assistant member 375. The common electrode 270 is supplied with the common voltage Vss, and is preferably made of a reflective metal such as calcium Ca, barium Ba, magnesium Mg, aluminum Al, silver Ag, etc., or a transparent material such as ITO and IZO. The common electrode 270 is disposed on the whole surface of the substrate, or at least substantially the whole surface of the substrate, and generates the currents with the pixel electrodes 191 as a pair.

The assistant member 375 is disposed between the second connecting member 86 and the common electrode 270, such that the assistant member 375 prevents shorts between the second connecting member 86 and the common electrode 270.

In the above-described OLED display, a first control electrode 124*a* connected to a gate line 121, a first input electrode 173*a* connected to a data line 171, and a first output electrode 175*a* along with a semiconductor island 154*a* form a switching TFT Qs having a channel formed in the semiconductor island 154*a* disposed between the first input electrode 173*a* and the first output electrode 175*a*. Likewise, a second control electrode 124*b* connected to the first output electrode 175*a*, a second input electrode 173*b* connected to a driving voltage line 172, and a second output electrode 175*b* connected to a pixel electrode 191 along with a semiconductor island 154*b* form a driving TFT Qd having a channel formed in the semiconductor island 154*b* disposed between the second input electrode 173*b* and the second output electrode 175*b*.

While the OLED display according to the present embodiment has been described as having only one switching TFT and one driving TFT, the OLED display according to the present invention may further include at least one TFT and a plurality of lines for driving the TFT for compensating and preventing the organic light emitting diode ("LD") and the driving TFT Qd from being degraded even if the OLED display is driven for a long time so as to prevent the lifetime of the OLED display from being shortened.

A pixel electrode 191, a light emitting member 370, and the common electrode 270 form an OLED LD having the pixel electrode 191 as an anode and the common electrode 270 as a cathode, or vice versa. The overlapping portions of a storage electrode 127 and a driving voltage line 172 form a storage capacitor Cst.

Now, an exemplary method of manufacturing the exemplary display panel shown in FIGS. 4 to 5 is described with reference to FIGS. 6 to 15 as well as FIGS. 4 to 5.

Figure 6:
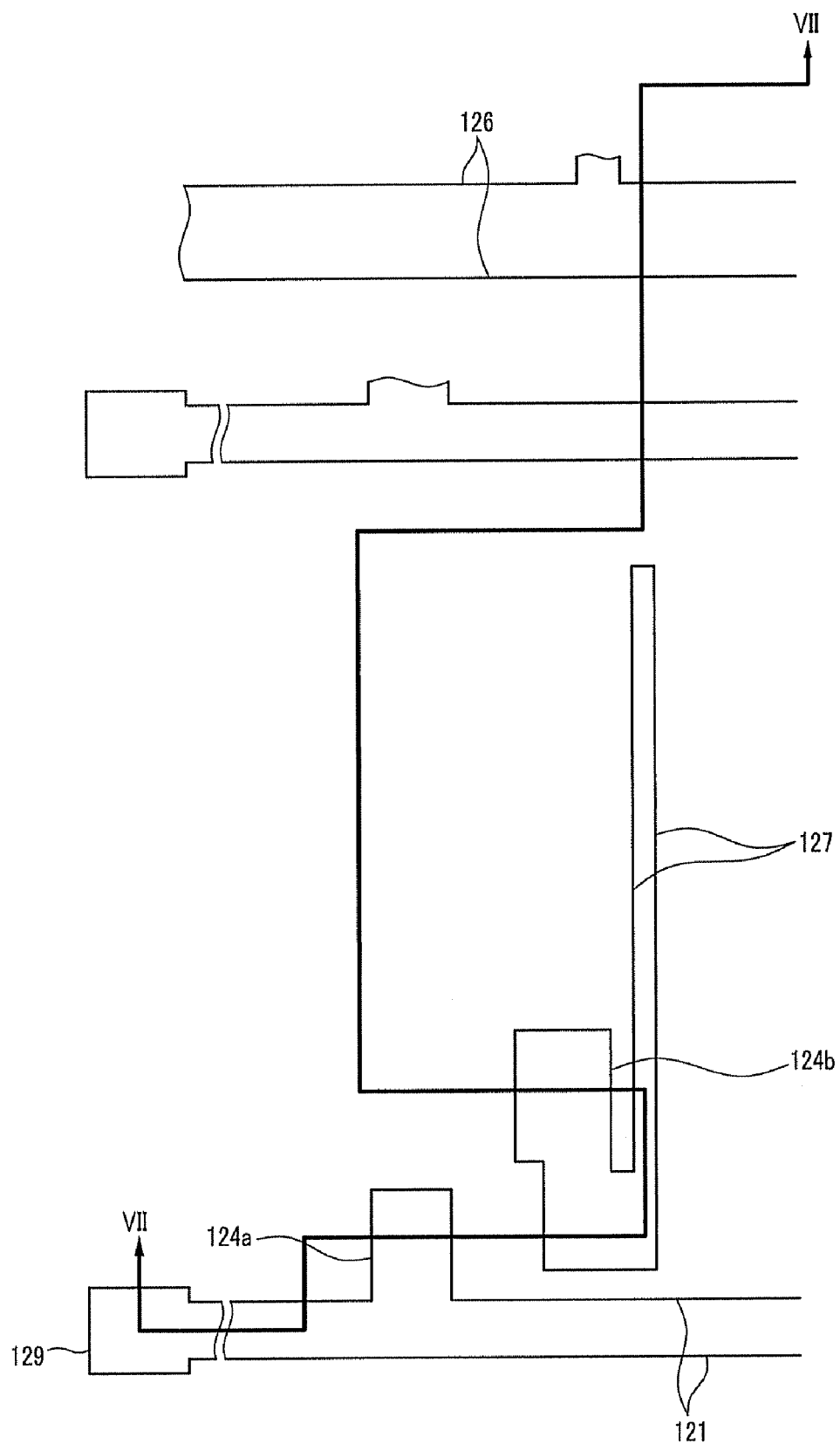
FIGS. 6, 8, 10, 12, and 14 are layout views of the exemplary display panel shown in FIGS. 4 and 5 in intermediate steps of an exemplary manufacturing method thereof according to an exemplary embodiment of the present invention.
Figure 7:
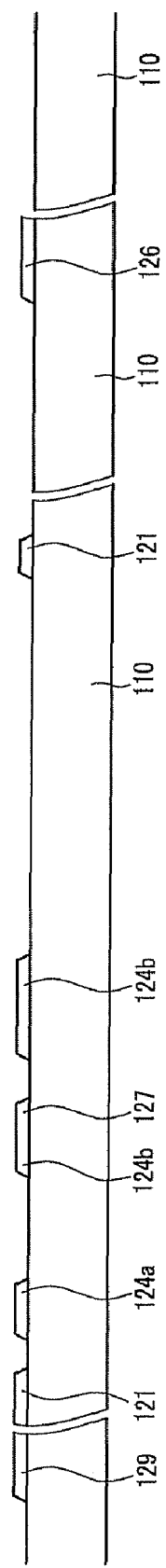
FIG. 7 is a sectional view of the exemplary display panel shown in FIG. 6 taken along line VII-VII.
Figure 8:
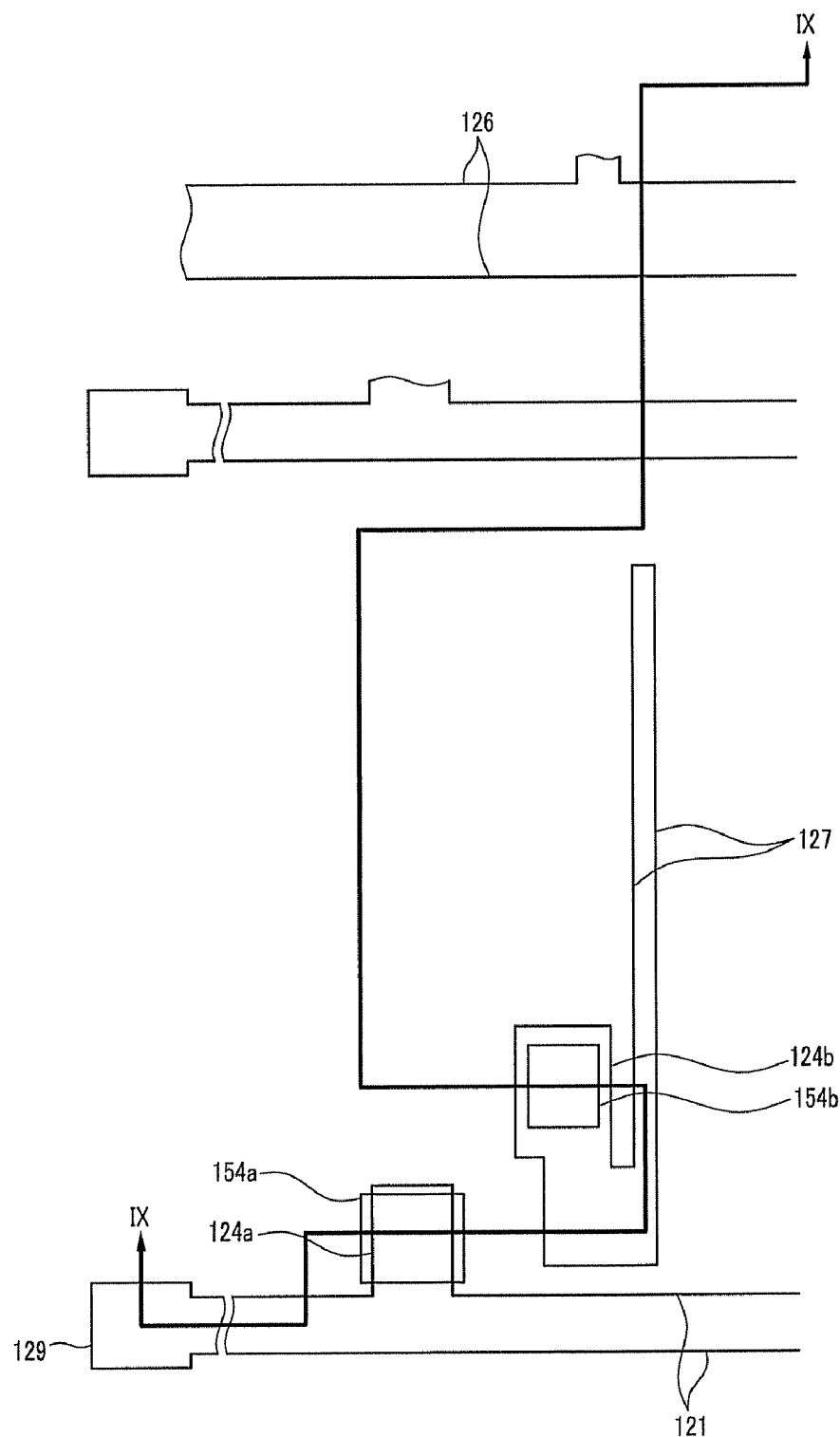
Figure 9:
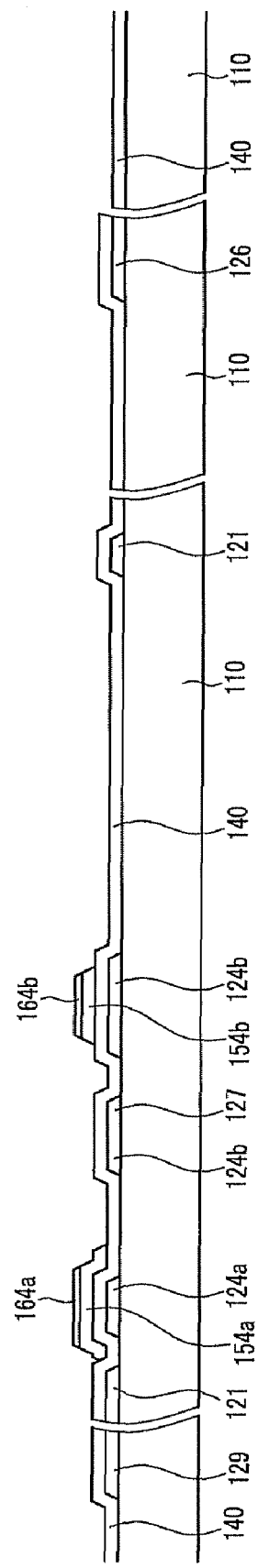
FIG. 9 is a sectional view of the exemplary display panel shown in FIG. 8 taken along line IX-IX.
Figure 10:
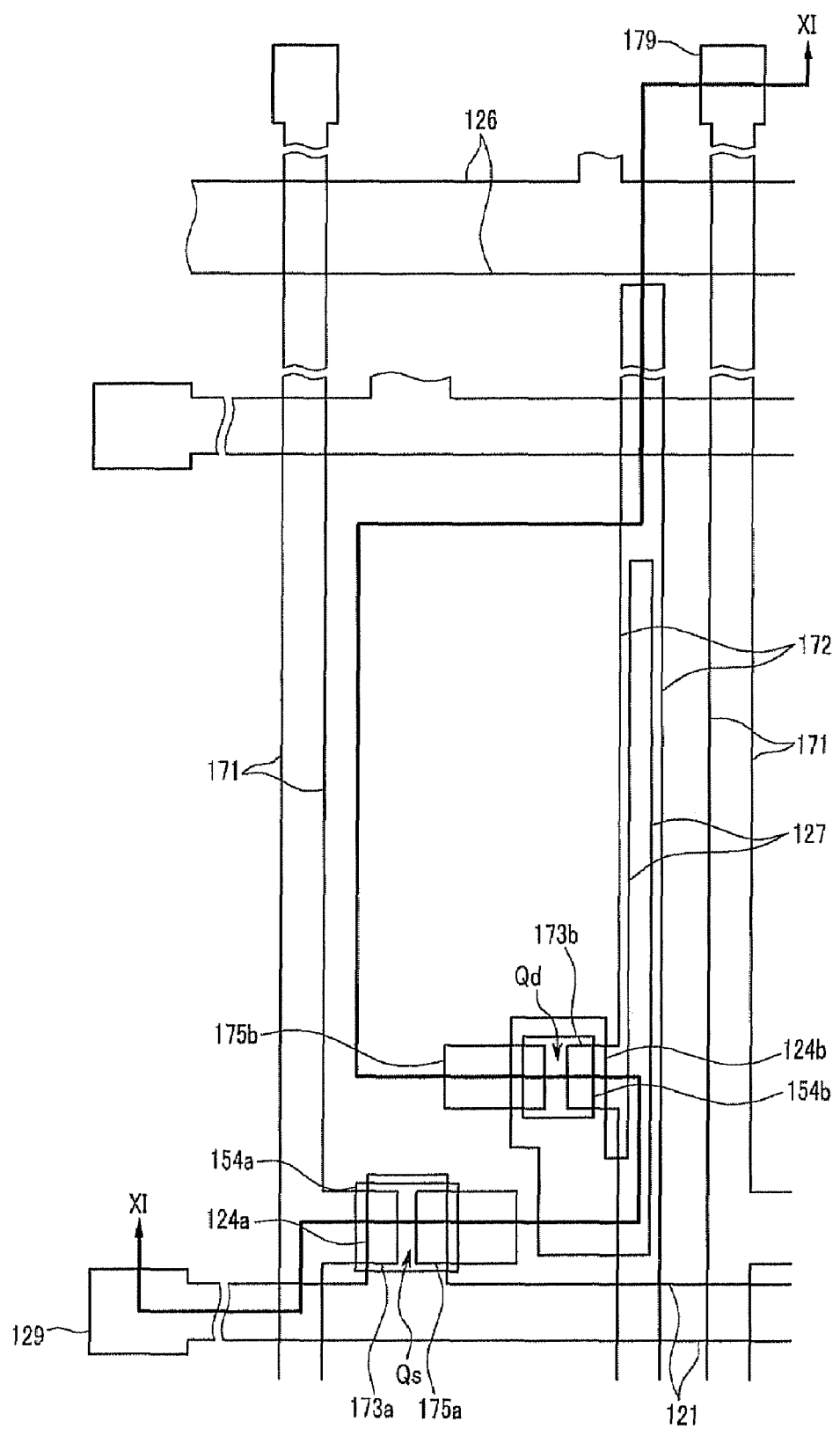
Figure 11:
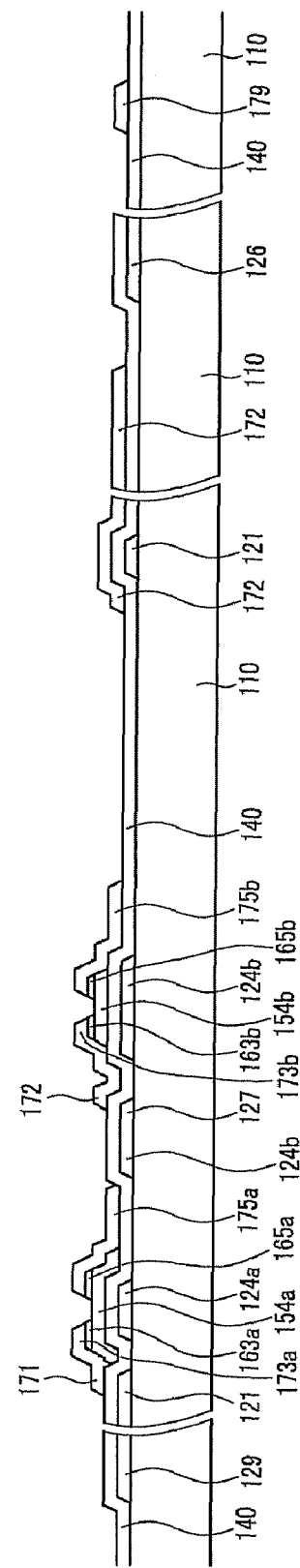
FIG. 11 is a sectional view of the exemplary display panel shown in FIG. 10 taken along line XI-XI.
Figure 12:
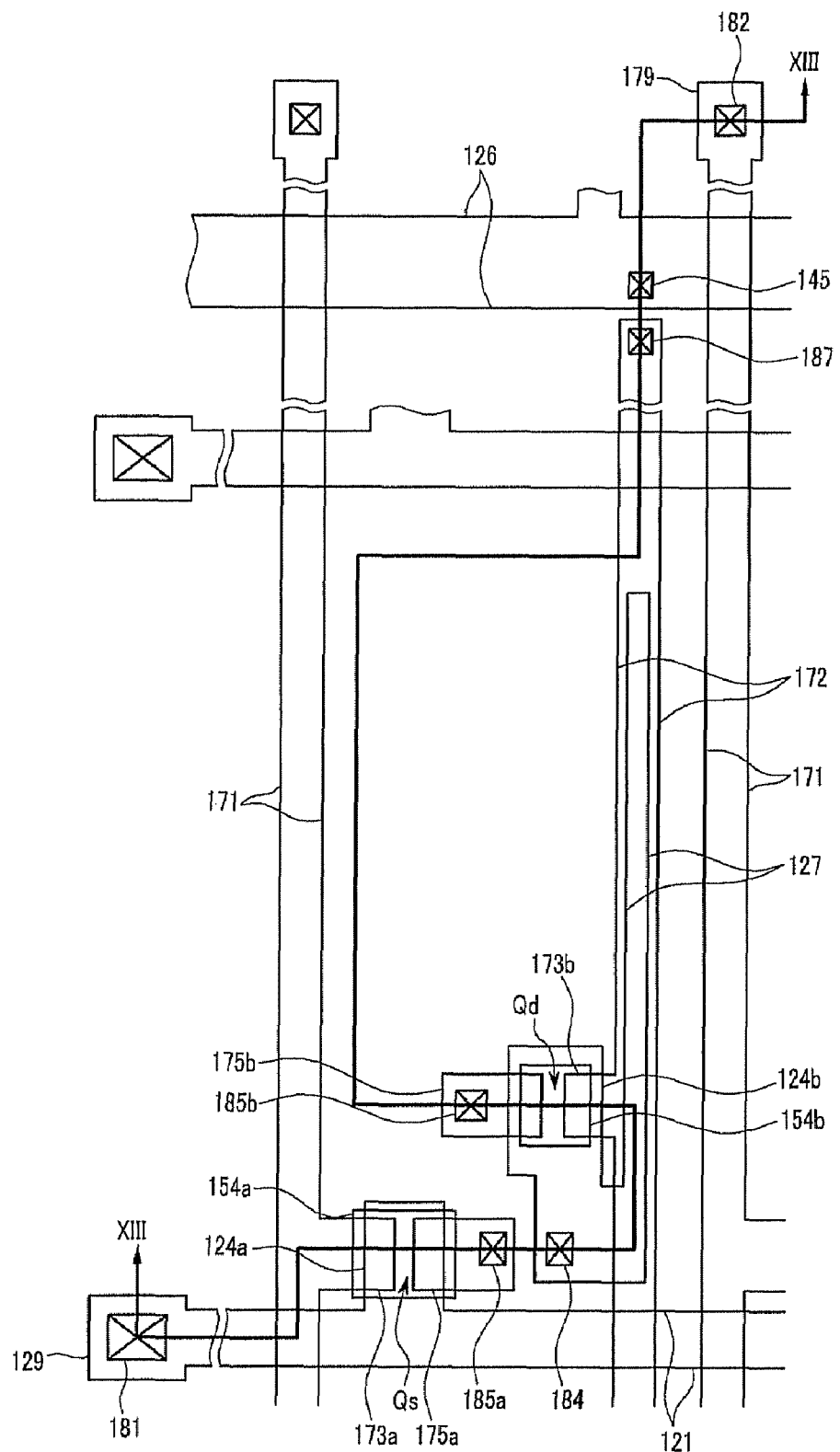
Figure 13:
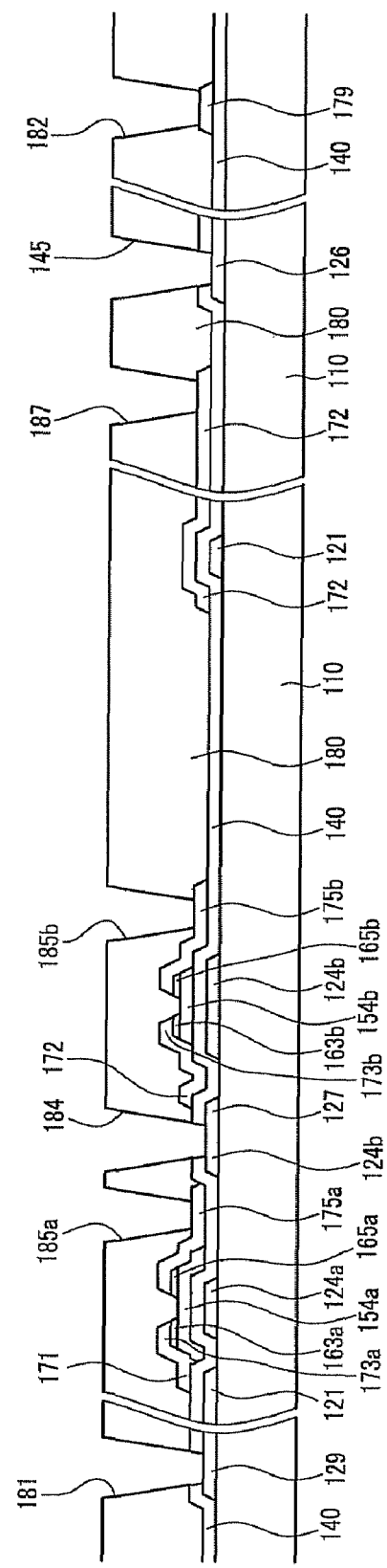
FIG. 13 is a sectional view of the exemplary display panel shown in FIG. 12 taken along line XIII-XIII.
Figure 14:
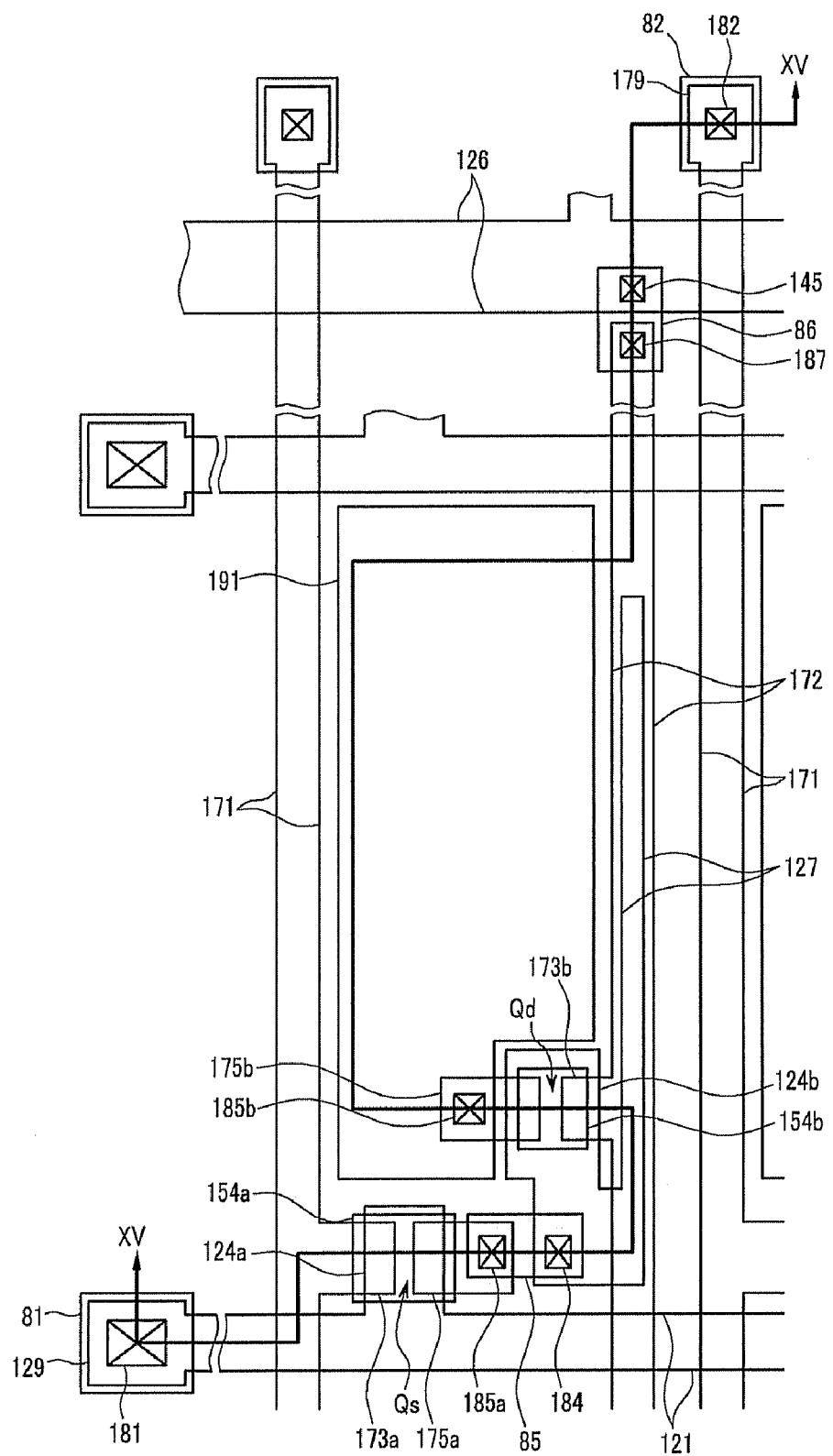
Figure 15:
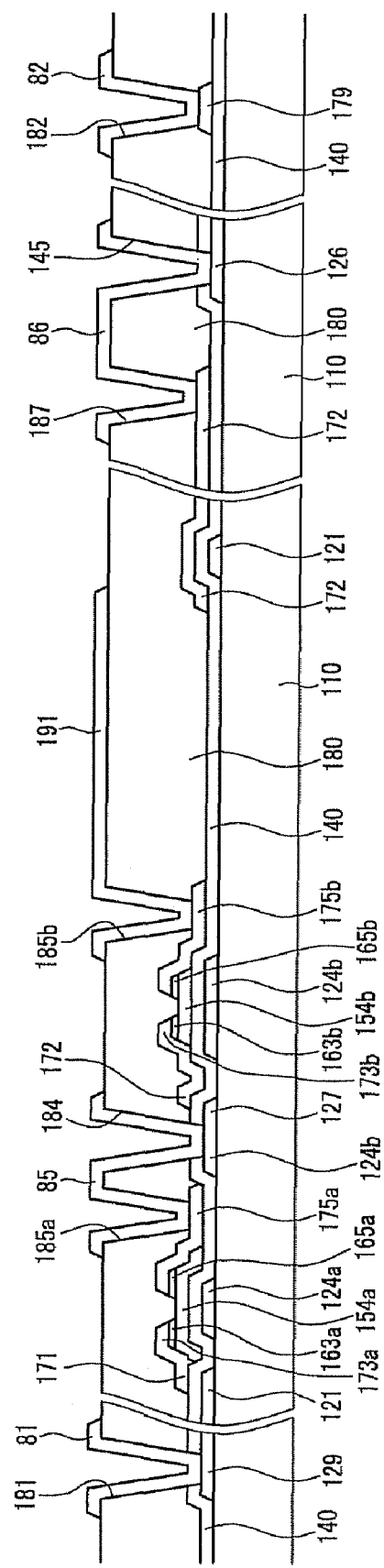
FIG. 15 is a sectional view of the exemplary display panel shown in FIG. 14 taken along line XV-XV.

FIGS. 6, 8, 10, 12, and 14 are layout views of the exemplary display panel shown in FIGS. 4 and 5 in intermediate steps of an exemplary manufacturing method thereof according to an exemplary embodiment of the present invention, FIG. 7 is a sectional view of the exemplary display panel shown in FIG. 6 taken along line VII-VII, FIG. 9 is a sectional view of the exemplary display panel shown in FIG. 8 taken along line IX-IX, FIG. 11 is a sectional view of the exemplary display panel shown in FIG. 10 taken along line XI-XI, FIG. 13 is a sectional view of the exemplary display panel shown in FIG. 12 taken along line XIII-XIII, and FIG. 15 is a sectional view of the exemplary display panel shown in FIG. 14 taken along line XV-XV.

As shown in FIGS. 6 and 7, a plurality of gate conductors that include a plurality of gate lines 121 including first control electrodes 124a and a plurality of end portions 129, a plurality of second control electrodes 124b including a plurality of storage electrodes 127, and a driving voltage connection 126 are formed on an insulating substrate 110 made of a material such as, but not limited to, transparent glass or plastic.

Referring to FIGS. 8 to 9, after sequential deposition, on the insulating substrate 110 having the gate conductors formed thereon, of a gate insulating layer 140, an intrinsic a-Si layer, and an extrinsic a-Si layer using chemical vapor deposition ("CVD"), the extrinsic a-Si layer and the intrinsic a-Si layer are photo-etched to form a plurality of extrinsic semiconductor islands 164a and 164b and a plurality of intrinsic semiconductor islands 154a and 154b on the gate insulating layer 140.

Next, as shown in FIGS. 10 and 11, a conductive layer is sputtered or deposited by CVD and photo-etched to form a plurality of data conductors that include a plurality of data lines 171 including a plurality of first input electrodes 173a and a plurality of end portions 179, a plurality of driving voltage lines 172 including second input electrodes 173b, and a plurality of first and second output electrodes 175a and 175b.

The exposed portions of the extrinsic semiconductor islands 164a and 164b, which are not covered with the data conductors 171, 172, 175a, and 175b, are removed by etching to complete a plurality of ohmic contact islands 163a, 163b, 165a, and 165b and to expose portions of the intrinsic semiconductor islands 154a and 154b.

Referring to FIGS. 12 to 13, a passivation layer 180 is deposited by CVD or printing, etc. on the data conductors, the exposed portions of the semiconductor islands 154a and 154b, and the exposed portions of the gate insulating layer 140, and patterned along with the gate insulating layer 140 to form a plurality of contact holes 181, 182, 184, 185a, 185b, 187 and 145 exposing the end portions 129 and 179 of the gate lines 121 and the data lines 171, portions of the second control electrodes 124b, the first output electrodes 175a, and the second output electrodes 175b, the driving voltage lines 172, and the driving voltage connection 126, respectively.

Next, as shown in FIGS. 14 and 15, a transparent conductive film is deposited on the passivation layer 180 and within the contact holes by sputtering, etc., and it is photo-etched to form a plurality of pixel electrodes 191, a plurality of first and second connecting members 85 and 86, and a plurality of contact assistants 81 and 82.

Referring again to FIGS. 4 to 5, a photosensitive organic insulator is spin-coated, exposed, and developed to form a partition 361 having openings 365 partly exposing the pixel electrodes 191. Next, a plurality of organic light emitting members 370 including an electron transport layer, a hole transport layer, and an emitting layer and an assistant member 375 are formed on the pixel electrodes 191 within the openings 365 and on the partition 361, respectively, where the assistant member 375 overlaps the second connecting member 86. The organic light emitting members 370 and the assistant member 375 may be formed by a solution process such as inkjet printing and evaporation. The organic light emitting members 370 and the assistant member 375 may be made of one body or as a separated pattern.

Additionally or alternatively, after forming the organic light emitting members 370 in the opening 365, an additional insulating material may be deposited or inkjet-printed to form the assistant member 375 covering the second connecting members 86.

A shadow mask may be used to form the assistant member 375. When forming the organic light emitting members 370 and the assistant member 375 of one body, an open shadow mask may be used, and when forming the organic light emitting members 370 and the assistant member 375 with a separation pattern, a fine shadow mask may be used.

Next, a common electrode 270 is formed on the organic light emitting members 370, the assistant member 375, and the partition 361.

As described above, the assistant member may prevent the driving voltage lines from shorting to the emitting diode.

Although preferred and exemplary embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:
1. A display device comprising:
a substrate;
a plurality of first and second signal lines formed on the substrate and insulated from each other;
a plurality of driving voltage lines formed with a same layer as the first signal lines or the second signal lines;
at least one driving voltage connection formed in a peripheral region excluding a display region with a different layer as driving voltage lines;
at least one connecting member electrically connecting the driving voltage lines and the driving voltage connection;
at least one first thin film transistor connected to the first and second signal lines;
at least one second thin film transistor connected to the first thin film transistor and the driving voltage lines;
at least one first electrode connected to the second thin film transistor;
a second electrode opposing the first electrode;
at least one organic light emitting member formed between the first electrode and the second electrode, and covering the at least one connecting member; and
at least one assistant member formed between the at least one connecting member and the second electrode, wherein the display region includes a pixel region defined by the first signal lines and the second signal lines intersecting the first signal lines.

2. The display device of claim 1, wherein the at least one assistant member includes an insulating material.

3. The display device of claim 1, wherein the assistant member includes a same material as the at least one portion of the organic light emitting member.

4. The display device of claim 1, wherein the at least one assistant member and the at least one organic light emitting member are made of one body.

5. The display device of claim 1, further comprising a photosensitive insulating layer formed between the at least one connecting member and the at least one assistant member.

6. The display device of claim 5, wherein the at least one connecting member is formed with a same layer as the at least one first electrode.

7. The display device of claim 1, wherein a thickness of the at least one assistant member is in a range of 500 to 3000 angstroms.

8. The display device of claim 1, wherein the at least one assistant member prevents the at least one connecting member from shorting with the second electrode.

9. A display device comprising:
a substrate;
a plurality of first and second signal lines formed on the substrate and insulated from each other;
a plurality of driving voltage lines formed with a same layer as the first signal lines;
at least one driving voltage connection formed in a peripheral region excluding a display region and with a same layer as the second signal lines;
at least one connecting member electrically connecting the driving voltage lines and the at least one driving voltage connection;
at least one first thin film transistor connected to the first and second signal lines;
at least one second thin film transistor connected to the at least one first thin film transistor and the driving voltage lines;
at least one first electrode connected to the at least one second thin film transistor;
at least one organic light emitting member formed on the at least one first electrode and the at least one connecting member, and is extended from the display region to cover the at least one connecting member; and
a second electrode facing the at least one first electrode,
wherein the display region includes a pixel region defined by the first signal lines and the second signal lines intersecting the first signal lines.

10. The display device of claim 9, wherein the at least one organic light emitting member comprises a first organic light emitting member formed between the at least one first electrode and the second electrode, and a second organic light emitting member apart from the first organic light emitting member,
and the display device further comprises a photosensitive insulating layer formed under the second organic light emitting member.

11. The display device of claim 9, wherein the at least one organic light emitting member prevents the at least one connecting member from shorting with the second electrode.

12. A display device comprising:
a display region including a plurality of pixels;
a peripheral region excluding the display region,
a driving voltage line extended from the display region to the peripheral region;
a driving voltage connection formed in the peripheral region; and
a connecting member connecting the driving voltage line to the driving voltage connection,
wherein the pixels include a first electrode, a second electrode facing the first electrode, and an organic light emitting member formed between the first electrode and the second electrode, and the organic light emitting member further covers the connecting member, and
wherein the display region includes a pixel region defined by the first signal lines and the second signal lines intersecting the first signal lines.

13. The display device of claim 12, wherein the organic light emitting member prevents the connecting member from shorting with the second electrode.

* * * * *